United States Patent [19]

Gerber et al.

[11] Patent Number: 5,732,025

[45] Date of Patent: Mar. 24, 1998

[54] OUTPUT INTERFACING DEVICE PROGRAMMABLE AMONG THREE STATES FOR A MEMORY IN CMOS TECHNOLOGY

[75] Inventors: Rémi Gerber; Janick Silloray, both of Nantes, France

[73] Assignee: Matra MHS, France

[21] Appl. No.: 661,175

[22] Filed: Jun. 10, 1996

[30] Foreign Application Priority Data

Jun. 12, 1995 [FR] France .................... 95 06915

[51] Int. Cl.⁶ .......................... G11C 16/04; G11C 7/00
[52] U.S. Cl. .......................... 365/189.05; 365/226
[58] Field of Search ............... 365/189.05, 226; 326/26, 27, 82, 83

[56] References Cited

U.S. PATENT DOCUMENTS

| | | | |
|---|---|---|---|
| 4,638,182 | 1/1987 | McAdams | 365/226 |
| 4,985,644 | 1/1991 | Okihara et al. | 365/189.05 |
| 5,057,711 | 10/1991 | Lee et al. | 365/189.05 |
| 5,067,109 | 11/1991 | Kim et al. | 365/189.05 |
| 5,295,098 | 3/1994 | Kohno | 365/189.05 |

FOREIGN PATENT DOCUMENTS 0368524  5/1990  European Pat. Off.

*Primary Examiner*—David C. Nelms
*Assistant Examiner*—Trong Phan
*Attorney, Agent, or Firm*—Larson & Taylor

[57] ABSTRACT

A three-state output interfacing device for a CMOS memory that comprises a stage for selective control of the device, receiving an input signal (I) at the bit frequency and a control signal (e) and making it possible to deliver, on two ports (A) and (B), either complemented signals (I), or distinct logic levels for driving the device into the high-impedance state, a first inverter stage delivering first inverted logic signals, from the ports (A) and (B), on two ports (C) and (D), a second inverter stage delivering second inverted signals from the ports (C) and (D), a stage for reducing the analog difference between the second inverted signals and for switching the output interfacing device into high-impedance state at ports (E) and (F), and an output stage receiving the signals from the ports (E) and (F) after reduction of analog difference and making it possible to fix and balance the current for charging and discharging the output capacitance of the output interfacing device and its high-impedance switching.

7 Claims, 3 Drawing Sheets

5,732,025

OUTPUT INTERFACING DEVICE PROGRAMMABLE AMONG THREE STATES FOR A MEMORY IN CMOS TECHNOLOGY

BACKGROUND OF THE INVENTION

The invention relates to an output interfacing device programmable among three states for a memory in CMOS technology.

At the present time, the electronic circuits of computing systems are having to employ an increasing number of memory cells, so as to hold ever greater volumes of stored information.

For this reason, it is desirable to ensure maximum separation between the integrated circuits, constituting the memory proper, and the external electronic circuits which are capable of processing this information, with a view to removing any risk of degrading the analog form of the purely analog signals.

Moreover, to the separation in analog terms between the memory proper and the external circuits it is advantageous to add the introduction of an output in the high-impedance state, so as dynamically to allow isolation of a part of the memory from the external circuits by switching the output to a third state, distinct from the complemented logic states of the signal delivered by the memory. In the course of these phases of isolation of all or part of a memory, an operation of writing to the isolated part can thus be carried out.

SUMMARY OF THE INVENTION

The subject of the present invention is the implementation of an output interfacing device programmable among three states for a memory in CMOS technology, allowing such objectives to be achieved.

A further subject of the present invention is the implementation of such an interfacing device in which the current switching noise is furthermore reduced.

A further subject of the present invention is the implementation of such an interface device in the form of an integrated circuit for which the physical size is reduced to a minimum, installation on the silicon substrate being facilitated, moreover, by reason of the simplicity of the production scheme.

A further subject of the present invention is the implementation of such an interfacing device in which the choice of the dimensional parameters of the CMOS transistors used in fact allows very flexible control of the operating conditions thereof.

The output interfacing device programmable among three states for a memory in CMOS technology according to the invention is fed by a power supply voltage with respect to a reference voltage. It is noteworthy in that it comprises, successively, in cascade, a stage for selective control of the interfacing device, receiving an input signal (I) and a control signal (e), which are delivered by the memory, making it possible to generate, on two output ports, either complemented logic signals from the input signal (I), or distinct logic levels making it possible to generate a high-impedance state at the output of the said interfacing device, a first inverter stage receiving the logic signals delivered by the two output ports of the control stage making it possible to generate first inverted logic signals on a first and a second output, a second inverter stage receiving the first inverted logic signals and making it possible to generate second inverted signals on a first and a second output, a stage reducing the analog difference between the second inverted signals and for switching at the output of the interfacing device into high-impedance state, and an output stage receiving the signals delivered by the analog-difference reducing stage, after difference reduction, the said output stage delivering an output signal making it possible to fix and balance the current for charging and discharging the output capacitance of the interfacing device.

It finds an application in the production of memories in CMOS technology, in integrated-circuit form.

BRIEF DESCRIPTION OF THE DRAWINGS

A more detailed description of the output interfacing device programmable among three states for a memory in CMOS technology, the subject of the present invention, will now be given in connection with the drawings in which.

DESCRIPTION OF THE PREFERRED EMBODIMENTS

Figure 1:
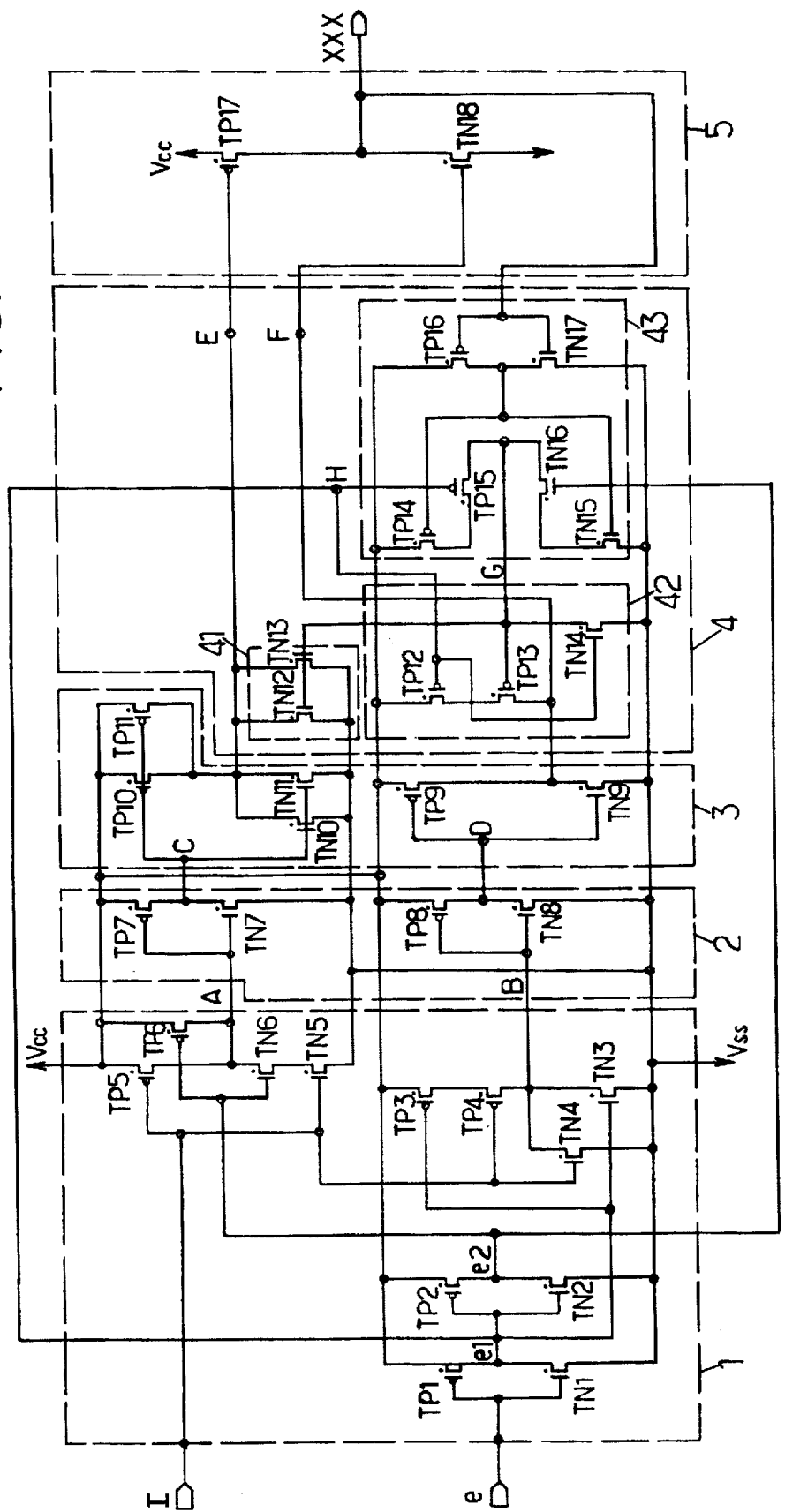
FIG. 1 represents an overall diagram of the output interfacing device programmable among three states for a memory in CMOS technology, the subject of the invention.

A more detailed description of an output interfacing device programmable among three states for a memory in CMOS technology, in accordance with the subject of the present invention, will now be given in connection with FIG. 1.

According to the abovementioned figure, the device which is the subject of the invention is fed by a power supply voltage, denoted $V_{cc}$, with respect to a reference voltage $V_{ss}$.

It comprises, successively, connected in cascade, a stage 1 for selective control of the interfacing device, this control stage receiving an input signal I and a control signal e, which are delivered by the memory. In a general way, it is shown that the input signal I consists of a rectangular signal at the bit frequency representing data read, for example, from the memory and intended for external circuits for processing these data, these external circuits being interconnected to the memory by means of the interfacing device which is the subject of the present invention.

The selective control stage 1 makes it possible to generate, on two output ports bearing the references A and B respectively, either complemented logic signals from the input signal I, or distinct logic levels making it possible to generate a high-impedance state at the output of the interfacing device as will be described later in the description.

The selective control stage 1 is followed by a first invertor stage, bearing the reference 2, which receives the logic signals delivered by the two output ports A, B of the control stage 1. The first inverter stage 1 makes it possible to generate first corresponding inverted logic signals on a first and a second output, bearing the references C, D.

The first inverter stage 2 is followed by a second inverter stage 3, which receives the first inverted logic signals and makes it possible to generate second inverted signals on a first and a second output, denoted E, F. The second inverter stage 3 is itself followed by a stage 4 reducing the analog difference between the second abovementioned inverted signals and for switching at the output of the interfacing device into high-impedance state. Finally, the analog-difference reducing stage 4 is itself followed by an output stage 5 receiving the signals delivered by the abovementioned analog-difference reducing stage 4, after reduction of the difference between the signals delivered at the previously mentioned terminals E and F, the output stage 5 thus delivering an output signal, denoted XXX, making it possible to fix and balance the current for charging and discharging the output capacitance of the interfacing device.

Before going further with the description of the interfacing device which is the subject of the present invention, it is mentioned that the output capacitance of this interfacing device consists not only of the intrinsic output capacitance of the interfacing device, but also of the input capacitance of any device interconnected at the output terminal of this interfacing device and receiving the abovementioned output signal XXX.

In a general way, it is mentioned that the stage reducing the analog difference between the second inverted signals and for switching at the output of the interfacing device into high-impedance state makes it possible to confer on the output interfacing device which is the subject of the present invention its character of being programmable among three states, the programmable character of this interfacing device resulting from the fact that, upon a specific command to the stage reducing the analog difference between the two inverted signals, the equivalence or near-equivalence of the second inverted signals delivered at the output terminals E and F of this difference reducing stage allows operation of a conventional type for the output interfacing device, the subject of the present invention, the latter then delivering the logic signal corresponding to the input signal I corresponding to the two conventional logic states at the bit frequency and representative of the data transported by the input signal I.

In contrast, upon a specific command to this same stage reducing the analog separation between the second inverted signals, the interfacing device, the subject of the present invention, makes it possible, by forcing the signals delivered by the output terminals E, F to distinct values, by way of a non-limiting example, the continuous value of the power supply voltage Vcc and the continuous value of the reference voltage Vss respectively, electrically to decouple the output stage 5 proper from the output terminals E, F of the analog-separation reducing stage 4, which makes it possible thus to place the output interfacing device in a high-impedance output state and to carry out the specific functions of writing in the memory which is thus decoupled from the user device.

The mode of operation for the control of the two-state output and the high-impedance output respectively is based, as far as the operation in two-state output mode is concerned, on feedback of the output signal XXX onto the analog-difference reducing stage 4, whereas the operation of the interfacing device in high-impedance output mode is based on a specific command to the same analog-difference reducing stage 4 based on the control signal e, as will be described later in the description.

A more detailed description of a specific advantageous embodiment of the control stage 1, of the first and second inverter stage 2, 3, of the analog-difference reducing stage 4 and of the output stage 5 will now be given in connection with the same FIG. 1.

It will be understood, obviously, that the abovementioned embodiment can advantageously itself be produced in CMOS technology, which obviously makes it possible to instal the output interfacing device programmable among three states, the subject of the present invention, directly within the memory circuit itself.

According to the abovementioned FIG. 1, it is seen that the control stage 1 advantageously comprises a first inverter comprising a PMOS transistor $TP_1$ and an NMOS transistor $TN_1$ which are connected in cascade between the power supply voltage and the reference voltage Vss. The two abovementioned transistors are controlled in parallel by the control signal e and deliver a first inverted control signal, denoted $e_1$, on their common drain-source electrode.

Moreover, a second inverter is provided, which comprises a PMOS transistor $TP_2$ and an NMOS transistor $TN_2$ which are connected in cascade between the power supply voltage Vcc and the reference voltage Vss. These two transistors are also controlled in parallel by the first inverted control signal e. They deliver a second inverted control signal, denoted $e_2$, on their common drain-source electrode.

As represented in FIG. 1, the control stage 1 further comprises a first module inverting the input signal I, comprising a PMOS transistor $TP_5$, an NMOS transistor $TN_6$ and an NMOS transistor $TN_5$ which are connected in cascade between the power supply voltage Vcc and the reference voltage Vss. Moreover, a PMOS transistor $TP_6$ is connected in parallel with the PMOS transistor $TP_5$, and the common gate electrode of the PMOS $TP_5$ and NMOS $TN_5$ transistors receives the input signal I. The common gate electrode of the PMOS $TP_6$ and NMOS $TN_6$ transistors receives the second inverted control signal $e_2$ and the common drain-source point of the PMOS $TP_5$, $TP_6$ and NMOS $TN_6$ transistors constitutes one of the output ports, output port A of the control stage 1.

Moreover, a second module inverting the input signal I comprises two PMOS transistors $TP_3$, $TP_4$ and an NMOS transistor $TN_3$ which are connected in cascade between the power supply voltage and the reference voltage Vss. An NMOS transistor $TN_4$ is furthermore connected in parallel with the NMOS transistor $TN_3$, and the common gate electrode of the PMOS $TP_3$ and NMOS $TN_3$ transistors receives the first inverted control signal $e_1$. The common gate electrode of the PMOS $TP_4$ and NMOS $TN_4$ transistors receives the input signal I and the common drain-source point of the PMOS $TP_4$ and NMOS $TN_4$, $TN_3$ transistors constitutes the other output port, output port B of the control stage 1.

The operation of the control stage 1 is as follows: the input signal I, by virtue of the control stage 1 and depending on the control signal e, allows the input signal I to control or not control the following part. This is because, if the control signal e is at the value of the power supply voltage Vcc, the output ports A and B are at the logic level of I but are complemented. If the control signal e is at the value of the reference voltage Vss, then the output port A is held at a voltage equal to the power supply voltage Vcc and the output port B is at the value of the reference voltage Vss. This latter state makes it possible to set the output of the interfacing device which is the subject of the present invention into high-impedance state, as will be described below in the description.

As far as the first inverter stage 2 is concerned, and by reference to FIG. 1, it is shown that the latter comprises a first inverter module formed by a PMOS transistor $TP_7$ and an NMOS transistor $TN_7$ which are connected in cascade between the power supply voltage Vcc and the reference voltage Vss. The common gate electrode of the abovementioned transistors is interconnected to the output port A of the first inverter module of the control stage 1, and the common drain-source point of the PMOS $TP_7$ and NMOS $TN_7$ transistors delivers the complemented logic signals from the logic signals delivered by the output port A of the first inverter module of the control stage 1.

The first inverter stage 2 further includes a second inverter module formed by a PMOS transistor $TP_8$ and an NMOS transistor $TN_8$ which are connected in cascade between the power supply voltage and the reference voltage, the common gate electrode of these transistors being interconnected to the output port B of the second inverter module of the control stage 1. The common drain-source point of the PMOS $TP_8$ and NMOS $TN_8$ transistors delivers the complemented logic signals from the logic signals delivered by the output port B of the second inverter module of the control stage 1.

Hence, the common drain-source point of the PMOS and NMOS transistors $TP_7$, $TN_7$, point C in FIG. 1, and the common drain-source point of the PMOS $TP_8$ and NMOS $TN_8$ transistors, point D in FIG. 1, deliver the first inverted logic signals which are no more than the complemented values of the signals at the output ports A and B previously mentioned in the description.

As for the second inverter stage 3, it comprises, as represented in FIG. 1, a first inverter module formed by two PMOS transistors $TP_{10}$, $TP_{11}$ which are connected in parallel and two NMOS transistors $TN_{10}$, $TN_{11}$, also connected in parallel, the PMOS and NMOS transistors $TP_{10}$, $TP_{11}$ and $TN_{10}$, $TN_{11}$ respectively each forming a set of transistors in parallel, each set being connected in cascade between the power supply voltage Vcc and the reference voltage Vss.

The common gate electrodes of the abovementioned PMOS and NMOS transistors receive the complemented logic signals, that is to say the first inverted logic signals delivered by the output terminal C of the first inverter module of the first inverter stage 2. The common drain-source point of each set of transistors in parallel $TP_{10}$, $TP_{11}$; $TN_{10}$, $TN_{11}$, connected in cascade, constitutes the first output of the second inverter stage 3.

The second inverter stage 3 also includes a second inverter module formed by a PMOS transistor $TP_9$ and an NMOS transistor $TN_9$ which are connected in cascade between the power supply voltage and the reference voltage Vss.

The common gate electrode of the abovementioned PMOS and NMOS transistors receives the complemented logic signals delivered by the terminal B of the second inverter module of the first inverter stage 2, and the common drain-source point of the abovementioned PMOS and NMOS transistors, $TP_9$, $TN_9$, constitutes a second output of the second inverter stage 3.

From the operating point of view, it is seen that the second inverter 3 makes it possible to complement the values of the logic signals delivered at the terminals C and D of the first inverter stage into complemented values delivered at the abovementioned output terminals. These output terminals of the second inverter stage 3 are denoted E and F, the same notation as relating to the output terminals of the analog-difference reducing stage 4 being used by reason of the fact that the corresponding outputs are directly linked, as represented in FIG. 1.

As far as the analog-level-difference reducing stage is concerned, as represented in the abovementioned figure, this advantageously comprises a first switching module 41 connected in parallel between the first output E of the second inverter stage 3 and the reference voltage Vss. This first switching module 41 consists of two NMOS transistors $TN_{12}$ and $TN_{13}$ connected in parallel and makes it possible, when it is turned on under control, to lower the value of the analog voltage of the signal delivered by the first abovementioned output terminal E.

Moreover, a second switching module 42 is connected in parallel between the second output of the second inverter stage F and the power supply voltage Vcc. The second switching module 42 consists of two PMOS transistors $TN_{12}$ and $TN_{13}$ forming a branch and thus makes it possible, when it is turned on under control, to increase the value of the output voltage of the second output of the second inverter module to the value of the power supply voltage Vcc.

The analog-level-difference reducing stage 4 also comprises a module 43 for control of the switching of the first 41 and of the second 42 switching module, this switching control module 43 operating in output-signal XXX feedback mode and allowing substantially simultaneous switching control of the first 41 and of the second 42 switching module.

This operating mode makes it possible either to reduce the analog level of the signal delivered by the first output E of the second inverter stage 3, or to increase the speed of discharge of the output capacitance upon a transition of the output signal from the value of the power supply voltage Vcc to the reference voltage Vss, or to set the output stage 5 to high-impedance output mode.

More specifically, it is seen that the control module 43 includes an inverter formed by two PMOS $TP_{16}$ and NMOS $TN_{17}$ transistors which are connected in cascade between the power supply voltage Vcc and the reference voltage Vss. The common gate electrodes of the abovementioned PMOS and NMOS transistors are connected to the output of the output stage 5 and thus receive the output signal XXX. The common drain-source point of the abovementioned transistors $TP_{16}$ and $TN_{17}$ delivers an inverted output signal.

The control module 43 also includes a switching circuit formed by two PMOS transistors $TP_{14}$, $TP_{15}$ and two NMOS transistors $TN_{15}$, $TN_{16}$ which are connected in cascade between the power supply voltage Vcc and the reference voltage Vss. The common gate electrodes of the PMOS $TP_{14}$ and NMOS $TN_{15}$ transistors receive the inverted output signal delivered by the common drain-source point of the transistors $TP_{16}$, $TN_{17}$. The PMOS $TP_{15}$ and NMOS $TN_{16}$ transistors receive the first $e_1$ and the second $e_2$ inverted control signal respectively on their gate electrode. The common drain-source point between the PMOS $TP_{15}$ and NMOS $TN_{16}$ transistors, the common point referenced G in FIG. 1, makes it possible to deliver the signal for substantially simultaneous switching control of the first 41 and of the second 42 switching means of the analog-level-difference reducing stage 4.

Finally, an NMOS transistor $TN_{14}$, which is connected between the common drain-source point between the PMOS $TP_{15}$ and NMOS $TN_{16}$ transistors and the reference voltage Vss, is additionally provided. The gate electrode of the NMOS transistor $TN_{14}$ receives the first inverted control signal $e_1$.

The operating mode of the analog-level-difference reducing stage 4 has the effect of reducing the voltage amplitude, in the analog sense, on the output terminal E of the analog-difference reducing stage 4 and, in contrast, of increasing the value of the voltage on the output terminal F of this same stage upon switching of the output, that is to say of the output signal XXX, from the value of the power supply voltage Vcc to the value of the reference voltage Vss during operation of the interfacing device, the subject of the present invention, in the mode with two logic states.

It is precisely at this moment that it is necessary to reduce the switching slope of the output signal XXX as the slope entails a bounce by the output signal after it has switched to the reference voltage Vss and pseudo-periodic oscillation of the reference power supply voltages brought down to the integrated-circuit chips level.

Figure 2:
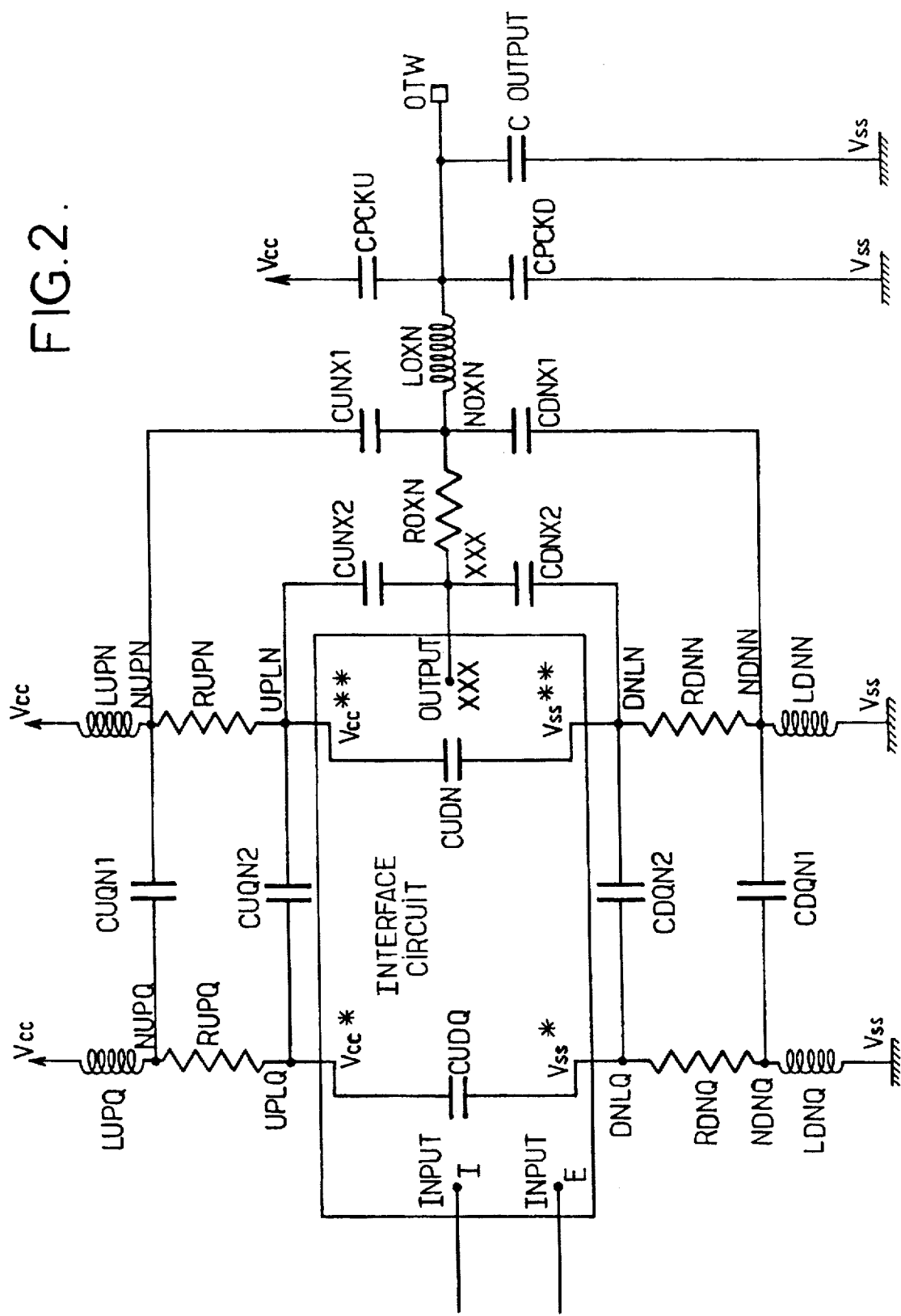
FIG. 2 represents a diagram of the stray inductances and capacitances of an interfacing device according to the invention, produced in integrated-circuit form.

As represented diagrammatically in FIG. 2, it is seen that these pseudo-periodic oscillations are due to the presence of the housing, which is connected to the interfacing circuit according to the invention and contains metallic connections which exhibit leakage inductances designated in the above-mentioned FIG. 2 by LUPQ, LUPN, LOXN, LDNN and LDNQ.

Moreover, these connections are coupled together by capacitive coupling due to the physical proximity thereof, these connections further exhibiting a certain electrical resistance depending on their length and their cross-section. The capacitive couplings and the corresponding resistances are denoted, in FIG. 2, RUPQ, RUPN, $CUQN_1$, $CUQN_2$, $CUNX_2$, $CUNX_1$, $CDNX_2$, $CDNX_1$, ROXN, RDNN, RDNQ, $CDQN_2$, $CDQN_1$, CPCKU and CPCKD. The output capacitance at output port OTW is designated by C OUTPUT. Moreover, the notations Vcc* and Vss* designate the power supply and reference voltages respectively, available on the data BUS (rail Vcc and rail Vss) when these voltage values are coupled by the stray capacitance CUDQ, the notations Vcc and Vss the power supply and reference voltages respectively, available on the peripheral buffer transistors $TP_{17}$ and $TN_{18}$ when these voltages are coupled by the stray capacitance CUDN.

The switching of the output signal XXX from the value of the power supply voltage Vcc to the value of the reference voltage Vss is the most critical since the switching thresholds to the reference voltage are lower than their equivalents towards the power supply voltage Vcc. Consequently, a pseudo-random oscillation on the power supplies Vss is liable to cause inadvertent switchings in the interfacing device according to the invention, by reason of the fact that the reference voltage Vss constitutes a reference for the gate-source voltage of all the NMOS transistors.

Hence, the feedback produced between the output of the output stage 5, delivering the output signal XXX, and the switching control module 43 of the stage 4 for reducing the analog difference on the levels of the signals delivered by the output signals E and F of this same stage 4, makes it possible to make the NMOS transistors $TN_{12}$ and $TN_{13}$ conduct so as to reduce the analog level of the signal present on the output terminal E when the output signal XXX passes from the value of the power supply voltage Vcc to the value of the reference voltage Vss. Such an operating mode has the effect of causing the PMOS transistor $TP_{17}$ to conduct sufficiently to slow the speed of discharge of the output capacitor C OUTPUT, but, however, in a sufficiently restricted way as not to cause too great an increase in the dynamic consumption of electrical energy by the interfacing device which is the subject of the present invention.

As for the output terminal F of this same analog-difference reducing stage 4, the more the amplitude of the output signal XXX falls towards the value of the reference voltage Vss, the more the voltage on the output terminal F rises towards the value of the power supply voltage Vcc, by virtue of the action of the second switching module 42, that is to say of the branch consisting of the PMOS transistors $TP_{12}$ and $TP_{13}$. This process has the consequence of accelerating the speed of discharge of the output capacitor C OUTPUT when the output signal XXX approaches, in the analog sense of the term, the value of the level of the reference voltage Vss when it switches from the value of the power supply voltage Vcc to the value of the reference voltage Vss.

As for the switching to high-impedance state, it is seen that the NMOS transistor $TN_{14}$ plays a specific role, making it possible to keep the value of the voltage at the terminal G, the common drain-source point of the transistors $TP_{15}$ and $TN_{16}$, at the value of the reference voltage Vss when the control signal e is at the value of the reference voltage Vss. This is because, when the terminal G is taken to the reference voltage Vss and in the case in which the first inverted control signal $e_1$ on the terminal H is at the value of the power supply voltage Vcc, the PMOS transistor $TP_{12}$ and the NMOS transistors $TN_{12}$ and $TN_{13}$ are open, the switching modules 41 and 42 then being switched to the open position, that is to say they are not conducting. As a consequence, the feedback structure is cut when the signal on the terminal E is at the value of the reference voltage Vss. In this case, the output terminals E and F are thus brought to the values of the power supply voltage Vcc and reference voltage Vss respectively, which makes it possible to cause decoupling of the output stage 5 as will be described below in connection with FIG. 1.

The abovementioned output stage 5 includes a PMOS transistor $TP_{17}$ and an NMOS transistor $TN_{18}$ which are connected in cascade between the power supply voltage Vcc and the reference voltage Vss. The common drain-source point of the abovementioned PMOS and NMOS transistors constitutes an output terminal for the output stage and also the output terminal of the device according to the invention. Moreover, the gate electrode of the PMOS transistor $TP_{17}$ is connected to the first output of the second inverter stage, and finally to terminal E of the analog-difference reducing stage 4, and the gate electrode of the NMOS transistor $TN_{17}$ is itself connected to the second output F of the second inverter stage, that is to say finally to the output terminal F of the analog-difference reducing stage 4.

Hence, it will be understood that, when the abovementioned output terminals E and F are taken respectively to the value of the power supply voltage Vcc and of the reference voltage Vss, the PMOS $TP_{17}$ and NMOS $TN_{18}$ transistors are deactivated, which makes it possible to place the output in the high-impedance state as mentioned previously in the description.

Hence, it will be understood that the output stage 5 makes it possible to fix and balance the current for charging and discharging the output capacitance Cout, using transistors $TP_{17}$ and $TN_{18}$.

Figure 3A:
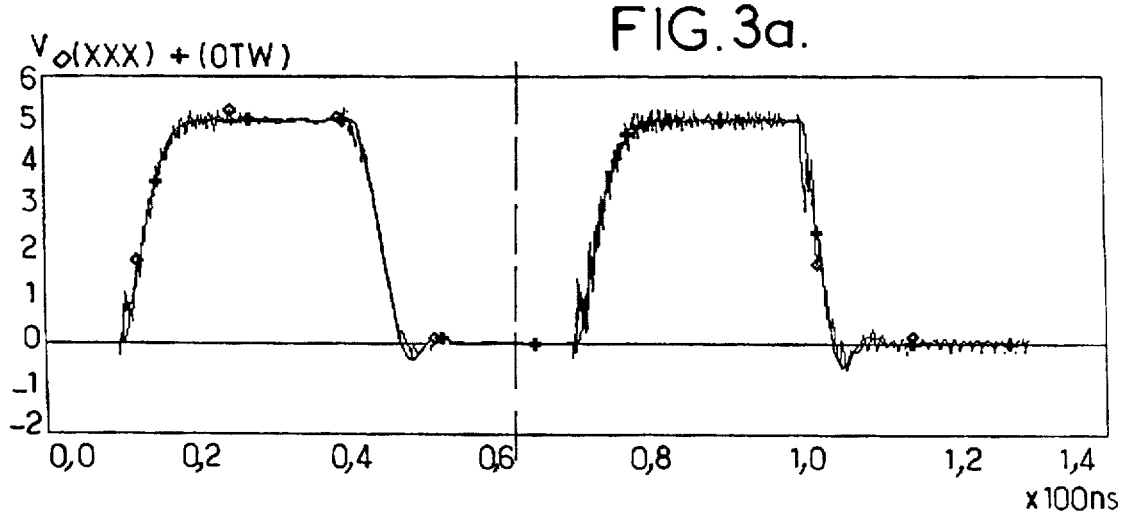
FIGS. 3a, 3b and 3c represent timing diagrams of signals sampled at the test points of FIGS. 1 and 2.

Timing diagrams representative of the signals at the test points as represented in FIG. 1 and FIG. 2 respectively have been represented in FIG. 3, at 3a, 3b and 3c. The timing diagrams are represented in the left-hand part of each figure when the feedback loop produced between the output of the output stage 5 and by means of the switching modules 41, 42 and of the switching control module 43 is active, which makes it possible markedly to reduce the noise level of the output signal, this feedback loop being active, obviously, when the output interfacing device programmable among three states, the subject of the present invention, is operating with two logic states representative of the input signal L. It will be noted, in particular, in FIG. 3a that, in the absence of feedback, the loop being open, the noise level is very much higher.

Figure 3B:
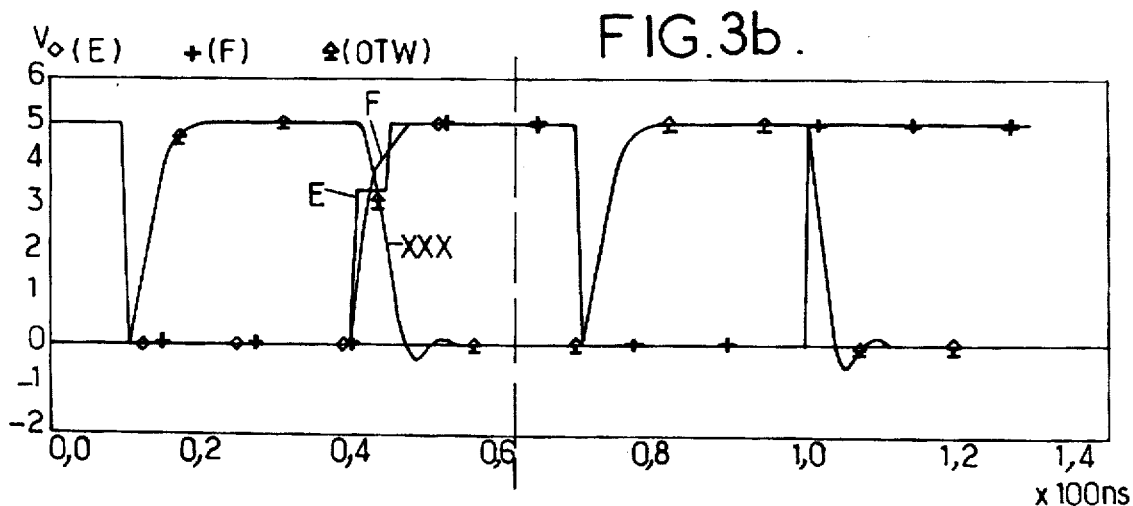

The signals obtained on terminal E and on terminal F respectively, as well as on the output capacitance C OUTPUT, the signal being designated V(OTW), have been represented in FIG. 3b, under the same conditions of the presence and absence of feedback.

It will be noted that, with feedback present and so as to provide control of the discharge of the output capacitance C OUTPUT, the signal E is delayed slightly with respect to the signal F, this slight offset particularly making it possible to provide control of the discharge of the output capacitance as mentioned previously in the description. This offset is sufficient to provide control of the noise level as represented in FIG. 3a, left-hand part, the equivalence or near-equivalence of the signals which is obtained on the terminals E and F, to within the abovementioned delay, making it possible, however, to provide for operation of the output interfacing device programmable among three states, the subject of the present invention, with the two logic states representative of the input signal I as mentioned previously in the description.

In contrast, in the right-hand part of FIG. 3b, that is to say in the absence of feedback, it is noted that the rise in voltage at the ports E and F towards the value Vcc is near-instantaneous, which makes it possible to place the interfacing circuit according to the invention in its low logic state without control of the noise level.

Figure 3C:
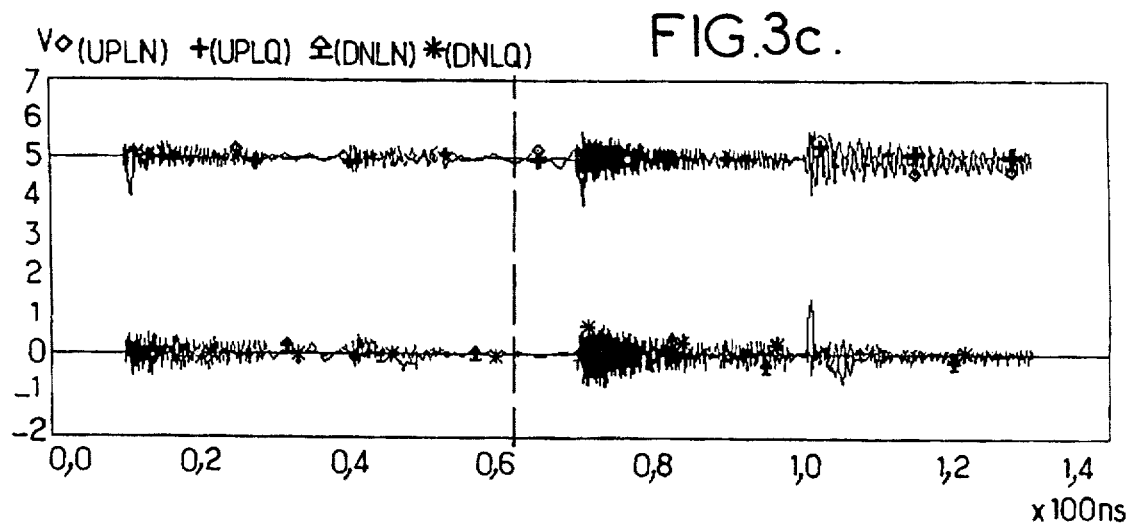

Finally, FIG. 3c represents timing diagrams recorded at points UPLN, UPLQ, DNLN and DNLQ of FIG. 2, that is to say at the stray links of the interfacing circuit which is the subject of the present invention. It will be noted, in particular, by comparison of the left-hand part and of the right-hand part of FIG. 3, that the noise level, that is to say the voltage level at the corresponding test points, is substantially reduced in the presence of feedback.

Hence, an output interfacing device has been described, programmable among three states for a memory in CMOS technology and which is of particularly high performance given that this device makes it possible not only to satisfy the noise criteria, but also to increase or reduce the feedback at will by, for example, altering the size and dimensional parameters of the transistors such as the transistors $TP_{12}$, $TP_{13}$, $TN_{12}$ and $TN_{13}$ for example. Finally it is seen that, depending on the level of feedback introduced, the propagation time of the signals is increased as a consequence.

We claim:

1. An output interfacing device programmable among three states for a memory in CMOS technology, said output interfacing device having an output and being fed by a power supply voltage (Vcc) with respect to a reference voltage (Vss), and being provided with an output capacitance, said device further comprising, connected in cascade:

a selective control stage for receiving an input signal (I) and a control signal (e) delivered by said memory for generating, on two output ports, either complemented logic signals from said input signal (I), or distinct logic levels for generating a high-impedance state at the output of said output interfacing device;

a first inverter stage for receiving said logic signals delivered by the two output ports of said selective control stage and for generating first inverted logic signals on first and second output ports of said first inverter stage;

a second inverter stage for receiving said first inverted logic signals and for generating second inverted signals having an analog difference on first and second output ports of said second inverter stage;

a further stage for reducing the analog level difference between said second inverted signals so as to produce reduced analog level difference second inverted signals for switching the output of said output interfacing device into said high-impedance state; and an output stage for receiving said reduced analog level difference second inverted signals produced by said further stage, and for producing an output signal for fixing and balancing a charge and discharge current for said output capacitance of said output interfacing device.

2. The output interfacing device according to claim 1, wherein said selective control stage comprises:

a first inverter comprising a PMOS transistor ($TP_1$) and an NMOS transistor ($TN_1$) which are connected in cascade between said power supply voltage (Vcc) and said reference voltage (Vss) and which are controlled in parallel by said control signal (e), said PMOS and NMOS transistors ($TP_1$, $TN_1$) of said first inverter delivering a first inverted control signal ($e_1$) on a common drain-source electrode;

a second inverter comprising a PMOS transistor ($TP_2$) and an NMOS transistor ($TN_2$) which are connected in cascade between said power supply voltage (Vcc) and said reference voltage (Vss) and which are controlled in parallel by said first inverted control signal ($e_1$), said PMOS and NMOS transistors ($TP_2$, $TN_2$) of said second stage delivering a second inverted control signal ($e_2$) on a common drain-source electrode;

a first inverter module inverting said input signal (I), comprising a PMOS transistor ($TP_5$), an NMOS transistor ($TN_6$) and an NMOS transistor ($TN_5$) which are connected in cascade between said power supply voltage (Vcc) and said reference voltage (Vss), a PMOS transistor ($TP_6$) being furthermore connected in parallel with said PMOS transistor ($TP_5$), the common gate electrode of the PMOS ($TP_5$) and NMOS ($TN_5$) transistors receiving said input signal (I) and the common gate electrode of said PMOS ($TP_6$) and NMOS ($TN_6$) transistors receiving said second inverted control signal ($e_2$), the common drain-source point of said PMOS ($TP_5$, $TP_6$) and NMOS ($TN_6$) transistors constituting one of said output ports of said selective control stage;

a second inverter module inverting said input signal (I), comprising two PMOS transistors ($TP_3$, $TP_4$) and between said power supply voltage (Vcc) and said reference voltage (Vss), an NMOS transistor ($TN_4$) being furthermore connected in parallel with said NMOS transistor ($TN_3$), the common gate electrode of said PMOS ($TP_3$) and NMOS ($TN_3$) transistors receiving said first inverted control signal ($e_1$) and the common gate electrode of said PMOS ($TP_4$) and NMOS ($TN_4$) transistors receiving said input signal (I), the common drain-source point of the PMOS ($TP_4$) and NMOS ($TN_4$, $TN_3$) transistors constituting the other of said output ports of said selective control stage.

3. The output interfacing device according to claim 2, wherein said first inverter stage comprises:

a first inverter module formed by a PMOS transistor ($TP_7$) and an NMOS transistor ($TN_7$) which are connected in cascade, the common gate electrode of said PMOS and NMOS transistors ($TP_7$, $TN_7$) of said first inverter module being connected to said one of said output ports of said first inverter module of the selective control stage, the common drain-source point of said PMOS ($TP_7$) and NMOS ($TN_7$) transistors delivering complemented logic signals from the logic signals delivered by said one output port of the first inverter module of said selective control stage;

a second inverter module formed by a PMOS transistor ($TP_8$) and an NMOS transistor ($TN_8$) which are connected in cascade, the common gate electrode of said PMOS and NMOS transistors ($TP_8$, $TN_8$) of said second inverter module being connected to said other of said output ports of said second inverter module of the selective control stage, and the common drain-source point of said PMOS ($TP_8$) and NMOS ($TN_8$) transistors delivering complemented logic signals from the logic signals delivered by said output port of said second inverter module of the selective control stage.

4. The output interfacing device according to claim 3, wherein said second inverter stage comprises:

a first inverter module formed by a first set of two PMOS transistors ($TP_{10}$, $TP_{11}$) which are connected in parallel and a second set of two NMOS transistors ($TN_{10}$, $TN_{11}$) which are connected in parallel, said first and second sets being connected in cascade between said power supply voltage (Vcc) and said reference voltage (Vss), a common gate electrodes of said PMOS and NMOS transistors of said first and second sets receiving complemented logic signals delivered by said first inverter module of the first inverter stage, said first and second sets having a common drain-source point constituting said first output port of the second inverter stage;

a second inverter module formed by a PMOS transistor ($TP_9$) and an NMOS transistor ($TN_9$) which are connected in cascade between said power supply voltage (Vcc) and said reference voltage (Vss), a common gate electrode of said PMOS and NMOS transistors of said second inverter module receiving complemented logic signals delivered by said second inverter module of the first inverter stage, a common drain-source point of said PMOS and NMOS transistors of said second inverter module constituting said second output port of the second inverter stage.

5. The output interfacing device according to claim 1, wherein said further stage comprises:

first switching means (41) including two NMOS transistors ($TN_{12}$, $TN_{13}$) which are connected in parallel between said first output of the second inverter stage and said reference voltage (Vss) said two NMOS transistors ($TN_{12}$, $TN_{13}$) of said first switching means being connected in parallel so as to receive a common switching control signal, said first switching means, when turned on by said common switching control signal, reducing, in analog voltage value, the second inverted signal delivered by said first output port of the second inverter stage;

second switching means (42) including a branch including first and second PMOS transistors ($TP_{12}$, $TP_{13}$), said second switching means being connected in parallel between said second output of the second inverter stage and said power supply voltage (Vcc) said second PMOS transistor ($TP_{13}$) of said second switching means receiving said common switching control signal, said second switching means, when turned on by said common switching control signal, increasing, in analog voltage value, the second inverted signal delivered by said second output port of the second inverter stage to the value of said power supply voltage (Vcc); and switching control means for controlling switching of said first and second switching control switching means in an output signal feedback mode, said switching control means generating said common switching control signal so as to allow substantially simultaneous control of switching of said first and second switching means, and acting either to reduce, in analog level, the second inverted signal delivered by said first output port of the second inverter stage, or to speed up discharge of said output capacitance upon a transition of said output signal of said output stage from a value corresponding to said power supply voltage (Vcc) to a value corresponding to the reference voltage (Vss), or to set said output stage to said high-impedance output mode.

6. The output interfacing device according to claim 5, wherein said switching control means include:

an inverter formed by PMOS ($TP_{16}$) and NMOS ($TN_{17}$) transistors which are connected in cascade between said power supply voltage (Vcc) and said reference voltage (Vss), the common gate electrodes of said PMOS and NMOS transistors being connected to said output of said output stage and receiving said output signal, the common drain-source point of said PMOS and NMOS transistors of said inverter of said switching control means delivering an inverted output signal;

a switching circuit formed by first and second PMOS transistors ($TP_{14}$, $TP_{15}$) and first and second NMOS transistors ($TN_{15}$, $TN_{16}$) which are connected in cascade between said power supply voltage (Vcc) and said reference voltage (Vss), common gate electrodes of the first PMOS ($TP_{14}$) and NMOS ($TN_{15}$) transistors of said switching circuit receiving said inverted output signal and the second PMOS ($TP_{15}$) and NMOS ($TN_{16}$) transistors of the switching circuit receiving, on respective gate electrodes, said first ($e_1$) and second ($e_2$) inverted control signals, respectively, the common drain-source point between the second PMOS ($TP_{15}$) and NMOS ($TN_{16}$) transistors of said switching circuit producing said switching control signal for substantially simultaneous switching of the first and second switching means of said further stage; and an NMOS transistor ($TN_{14}$) connected between the common drain-source point between the second PMOS ($TP_{15}$) and NMOS ($TN_{16}$) transistors and said reference voltage (Vss), and having a gate electrode which receives said first inverted control signal ($e_1$).

7. The output interfacing device according to claim 1, wherein said output stage comprises a PMOS transistor ($TP_{17}$) and an NMOS transistor ($TN_{18}$) which are connected in cascade between said power supply voltage (Vcc) and said reference voltage (Vss), the common drain-source point of said PMOS and NMOS transistors constituting an output terminal for said output stage and the output terminal of said output interfacing device, the gate electrode of said PMOS transistor ($TP_{17}$) being connected to said first output of said second inverter stage and the gate electrode of said NMOS transistor ($TN_{17}$) being connected to said second output of said second inverter stage.

\* \* \* \* \*